(12) United States Patent
Ono et al.

(10) Patent No.: US 6,207,739 B1
(45) Date of Patent: Mar. 27, 2001

(54) POLYAMIDE ACID COMPOSITION CONTAINING METAL, POLYIMIDE FILM, FLEXIBLE PRINTED WIRING BOARD AND METHOD FOR PRODUCING THEM

(75) Inventors: Kuzuhiro Ono; Masaru Nishinaka; Kiyokazu Akahori, all of Otsu (JP)

(73) Assignee: Kanegafuchi Kagaku Kogyo Kabushiki, Osaka (JP)

( * ) Notice: Subject to any disclaimer, the term of this patent is extended or adjusted under 35 U.S.C. 154(b) by 0 days.

(21) Appl. No.: 09/196,310

(22) Filed: Nov. 20, 1998

(30) Foreign Application Priority Data

Nov. 20, 1997 (JP) .................................................. 9-319449
Feb. 20, 1998 (JP) .................................................. 10-038286

(51) Int. Cl.[7] ........................................................ C08K 5/20
(52) U.S. Cl. .......................... 524/218; 524/317; 524/357
(58) Field of Search .................................. 524/600, 218, 524/317, 357

(56) References Cited

U.S. PATENT DOCUMENTS

| | | | | |
|---|---|---|---|---|
| 3,616,200 | * | 10/1971 | Reibach | 161/225 |
| 4,725,504 | * | 2/1988 | Knudsen | 428/458 |
| 4,810,563 | * | 3/1989 | DeGee | 428/209 |
| 4,816,526 | * | 3/1989 | Bristowe | 525/422 |
| 5,621,068 | * | 4/1997 | Okamoto | 528/353 |
| 5,637,382 | * | 6/1997 | Kataoka | 428/209 |
| 5,837,767 | * | 11/1998 | Shimokusuzumo | 524/497 |
| 5,955,566 | * | 9/1999 | Lee | 528/310 |

* cited by examiner

Primary Examiner—Paul R. Michl
(74) Attorney, Agent, or Firm—Pillsbury Madison & Sutro LLP

(57) ABSTRACT

The object of the present invention is to provide a polyimide film, a flexible printed wiring board consisting thereof, and a polyimide molding, wherein various metal compounds are added to improve their properties and to provide them with noble properties.

28 Claims, No Drawings

POLYAMIDE ACID COMPOSITION CONTAINING METAL, POLYIMIDE FILM, FLEXIBLE PRINTED WIRING BOARD AND METHOD FOR PRODUCING THEM

FIELD OF THE INVENTION

The present invention relates to a polyamide acid composition, a polyimide film consisting thereof, a polyimide molding, and a flexible printed wiring board and a method for producing them.

BACKGROUND OF THE ART

As is commonly known, a polyimide film has various excellent properties such as heat-resistance, cold resistance, chemical-resistance, insulation and mechanical strength. Therefore, a polyimide film is widely used as electronic materials such as an electric insulating film, a flexible printed wiring board and the like.

To produce an electric insulating film and a flexible printed wiring board, a polyimide film can be bonded to a copper foil by using acrylic or epoxy-base flexible adhesive agent, or it can be bonded directly to a metal layer without using any adhesive agents by vacuum evaporation or spatter evaporation. In any cases to produce a flexible printed wiring board or the like, it is inevitable that a polyimide film be bonded well together to an adhesive layer and/or a metal layer.

As a flexible printed wiring board produced by using a polyimide film is often exposed to an atmosphere of high temperature and high humidity, there has been a strong demand for a flexible printed wiring board having a strong adhesive property, which is not spoiled even under high temperature and high humidity.

Various attempts to improve an adhesive strength between a polyimide film and an adhesive agent or a metal layer has been made. One of the attempts is that the surface of a polyimide film is roughened and another attempt is that reactive functional group is introduced to the surface of a polyimide film by applying such techniques as corona discharge treatment, plasma treatment, or chemical surface treatment. However, in any attempts, it is difficult to keep an adhesive strength from deteriorating under an atmosphere of high temperature and high humidity.

In order to prevent an adhesive property from deteriorating under high temperature and high humidity, various inorganic or organic metallic compounds have been added to a polyimide film to control a higher-order structure of polyimide.

For example, U.S. Pat. No. 4,742,099 discloses a polyimide film containing titanic organo-compound to improve an adhesive strength of a polyinide film.

JP Pat. No. 7-299883 discloses a polyimide film produced by adding a organic tin compound to a polyamide acid solution or a polyamide acid polymer not to spoil a high bonding strength and a high adhesive strength of a polyimide film after aging under an atmosphere of high temperature and high humidity.

JP Pat. No. 7-503984 also discloses a polyimide film produced by adding an organometallic compound such as tin compound and the like with polyamide acid polymer before a casting step, to improve an adhesive strength of a polyimide film after aging under an atmosphere of high temperature and high humidity.

Furthermore, in order to provide a polyimide film with other properties than an adhesive property, various metallic compounds are often added.

U.S. Pat. No. 3,073,784 to A. L. Endrey et. al discloses that a polyimide film with an improved electric conductivity, which is produced by adding silver salt to an organic solvent solution of polyamide acid, curing the obtained solution and simultaneously reducing the size of a metallic particle to 0.8 μm to keep a polyimide film transparent.

Macromolecules, 17, pp. 1627–1632(1984) discloses a polyimide film containing stannic chloride or dibutyltin chloride to decrease an electric resistance of the film.

Larry T. Taylor et. al (K. L. Mittal POLYIMIDES Synthesis, Characterization, and Applications) report that a rise of Tg and the improvement of mechanical strength under a high temperature can be seen by adding $Al(acac)_3$, $AgNO_3$, $Li_2PdCl_4$ and $AuI_3$ to polyimide.

Robin E. Southward et. al report that adding fusible lanthanoid (III) acetate trihydrate to a polyimide film makes the coefficient of linear expansion of a polyimide film small.

Furthermore, polyimide molding has also various properties such as abrasion resistance, chemical resistance, radioactive resistance in addition to excellent heat resistance. Therefore, it is widely used as mechanism elements such as slide members, or automobile parts, office appliance, electrical and electric equipment, apparatus of aerospace sector and atomic sector, and general industrial machinery. However, to further use a polyimide molding as an alternate material of metal, precision mechanism element and the like, it is inevitable to improve mechanical properties of a polyimide molding such as mechanical strength and toughness and it is important to add or improve these properties by adding various metallic compounds.

As described above, some attempts to add various metallic compound have been made to improve properties of a polyimide film and a polyimide molding and to provide them with a novel property.

Generally, polyimide is prepared from polyimide acid, a precursor of polyimide, by dehydration. A polyimide film is obtained through the following steps:

mixing an organic solvent solution of polyamide acid with a dehydrating and cyclizing agent and casting a mixture to form a film; and heating a film-shape mixture at a high temperature after drying it. There are 4 types of methods to add various inorganic or organic metallic compounds in these steps as follows.

One of the methods is to add various inorganic and organic metallic compounds to an organic solvent solution of polyamide acid, a precursor of polyimide.

Another method is to add various inorganic and organic metallic compounds at the early stage of synthesizing polyamide acid, a precursor of polyimide.

Another method is to add various inorganic and organic metallic compounds to a dehydrating and cyclizing agent and catalyst.

The other method is to coat a partially-cast or partially-dried base film of polyamide acid with an organic solvent solution of metal salt, and then to heat and dry the coated base film while completely conversing said polyamide acid into polyimide.

However, in any above methods except the last one, when inorganic or organic metallic compounds are added to an organic solvent solution of polyimide acid, cross-link between metallic atom and functional group of polyamide acid is formed. As the cross-link is formed between macromoleculars, the gelation of organic solvent solution of polyamide acid takes place, which makes it difficult to cast the organic solvent solution of polyamide acid to form a film.

The organic solvent solution of polyamide acid may possibly be cast, however, a gelling part of organic solvent solution of polyamide acid leads to problems in appearance (e.g. a black spot and uneven thickness, etc.) in the process of heating the film.

In addition to the problems in appearance, such properties as electric insulation, chemical-resistance, mechanical strength and the like degrade considerably.

In the case of the last method, there is no problems to cast an organic solvent solution of polyamide acid to form a film. However, when a partially-cast or partially-dried base film of polyamide acid is coated with an organic solvent solution of metal salt, partial gelation takes place on the surface layer of the film. A gelling part leads to problems in appearance and furthermore such properties as electric insulation, chemical-resistance, mechanical strength and the like degrade considerably.

OBJECTS AND SUMMARY OF THE INVENTION

As the result of our researches to obtain polyimide film containing metal and to remove the above disadvantages, we have eventually completed a method for adding metallic compounds to an organic solvent solution of polyamide acid without gelation taking place. Additionally, by using this method, we have eventually found a polyamide acid composition having excellent aging property of adhesive strength and mechanical strength, and also having excellent properties peculiar to polyimide, without any problems in appearance.

A general object of the present invention is to provide a polyamide acid composition containing an organic solvent solution of polyamide acid, inorganic and organic metallic compounds, and inhibitors for gelation.

Another object of the present invention is to provide a polyamide acid composition containing an organic solvent solution of polyamide acid, dehydrating and cyclizing agent, catalyst, inorganic and organic metallic compound, and inhibitor for gelation.

A further object of the present invention is to provide a polyamide acid composition containing one or more inhibitors for gelation selected form the group consisting of compounds represented by the general formula (1)

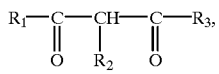

the general formula (2)

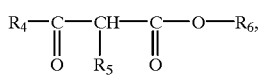

the general formula (3)

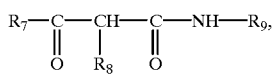

and the general formula (4)

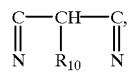

wherein $R_1$, $R_3$, $R_4$, $R_6$, $R_7$ and $R_9$ each represent the same or different aliphatic group or aromatic group containing 1 to 12 of carbon atoms, $R_2$, $R_5$, $R_8$ and $R_{10}$ each represent an aliphatic group or aromatic group containing a hydrogen atom or 1 to 12 of carbon atoms, and $R_1$ and $R_3$, $R_4$ and $R_6$, and $R_7$ and $R_9$ may be combined together to form a ring.

Another object of the present invention is to provide a polyamide acid composition, wherein said inhibitors for gelation are one or more selected form the group consisting of acetylacetone, methylacetoacetate, ethylacetoacetate, alinideacetoacetate, and malononitrile.

Still another object of the present invention is to provide a polyamide acid composition, wherein said inorganic or organic metallic compounds are organic metallic compounds including at least one selected form the group consisting of Ti, Zr, V, Nb, Cr, Mo, Mn, Fe, Ru, Co, Rh, Ni, Pd, Cu, Ag, Zn, Si, Sn, Pb, Sb, and Bi.

A further object of the present invention is to provide a polyamide acid composition, wherein said inorganic or organic metallic compounds are titanium organic metallic compounds.

A still further object of the present invention is to provide a polyamide and composition, wherein said titanium organic metallic compounds are one or more selected from the group consisting of the compounds represented by the general formula (5);

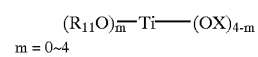

m = 0~4

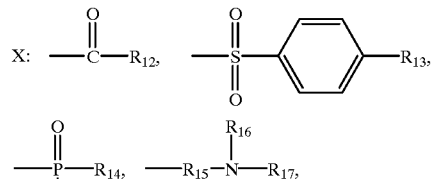

$C_3$~$C_{18}$ hydrocarbon residue
or $C_3$~$C_{18}$ carboxylic acid and their ammonium salt $R_{11}$: —H or $C_{3-8}$ hydrocarbon residue $R_{12}$, $R_{13}$: $C_{3-18}$ hydrocarbon residue $R_{14}$: $C_{3-18}$ hydrocarbon residue,

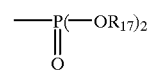

$R_{15}$, $R_{16}$: $C_{3-18}$ hydrocarbon residue $R_{17}$: $C_{2-18}$ hydrocarbon residue the general formula (6);

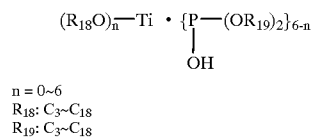

$n = 0\sim6$
$R_{18}$: $C_3\sim C_{18}$
$R_{19}$: $C_3\sim C_{18}$ and the general formula (7);

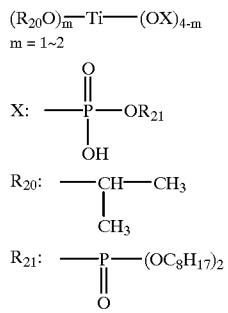

$m = 1\sim2$ and the metal composition is 0.001 to 0.1 wt % of a finally-cured polyimide film.

Another object of the present invention is to provide a polyamide acid composition, wherein said titanium organic metallic compound is a titanium organic metal chelate compound.

A further object of the present invention is to provide a polyamide acid composition, wherein said titanium organic metal chelate compound is a compound consisting of a titanium atom combined with one or more ligands selected from the group consisting of β-diketone, hydroxy carboxylic acid, keto-ester chelate, and glycol.

A still further object of the present invention is to provide a polyamide acid composition, wherein polyamide acid is obtained from pyromellitic acid dianhydride, 4,4'-diaminodiphenyl ether, and p-phenylene diamine.

Another object of the present invention is to provide a polyimide film obtained by the use of any one of said polyamide acid compositions.

A further object of the present invention is to provide a polyamide molding obtained by the use of any one of said polyamide acid compositions.

A still further object of the present invention is to provide a flexible printed wiring board produced by laminating said polyimide film and a copper foil together with an adhesive agent.

Another object of the present invention is to provide a flexible printed wiring board produced by bonding a metal layer directly to said polyimide film.

A further object of the present invention is to provide a method for producing said polyimide film, wherein said inorganic or organic metallic compounds and said inhibitors for gelation are added in any steps of producing said polyamide acid composition.

A still further object of the present invention is to provide a method for producing said polyimide film, wherein said inhibitors for gelation are added in any steps of producing polyamide acid and said inorganic or organic metallic compounds are added after or at the same time of adding the inhibitors for gelation.

Another object of the present invention is to provide a method for producing said polyimide film, wherein said ihibitors for gelation are added to said organic solvent solution of polyamide acid.

A further object of the present invention is to provide a method for producing said polyimide film, wherein said inhibitors for gelation are added to a mixed solution of a dehydrating and cyclizing agent and catalyst.

A still further object of the present invention is to provide a method for producing said polyimide film, wherein said titanium organic compounds are added to said organic solvent solution of polyamide acid in the step of preparing said polyamide acid composition.

Another object of the present invention is to provide a method for producing said polyimide film, wherein said titanium organic metallic compounds are added to said mixed solution of dehydrating and cyclizing agent and catalyst in the step of producing said polyamide acid composition.

As described above, a polyimide film and a polyimide composition of the present invention are produced by adding to a precursor of polyimide, namely, a polyamide acid composition, which contains inorganic or organic metallic compound. Therefore, the present invention makes it possible to produce a polyimide film and polyimide composition which have a good external appearance and can fully exhibit a effect of added metallic compounds without any gelation taking place. A polyimide film or a polyimide composition of the present invention can be used for various kinds of electrical or electronic machinery and apparatus such as electrical insulating film, flexible printed wiring board, and the like.

DESCRIPTION OF THE PREFERRED EMBODIMENTS

An example of the preferred embodiments in regard to a polyimide acid composition, a polyimide film, a flexible printed circuit board, a polyamide molding, and a method of producing said polyamide molding related to the present invention are described below.

Basically, all the known polyimide acid can be used in the present invention.

Normally, polyamide acid used in the present invention is produced by stirring an organic solvent solution of polyamide acid obtained by dissolving substantially equimolar amount of at least one kind of aromatic acid dianhydrides and at least one kind of diamines in organic solvent under the temperature-controlled condition until polymerization of said aromatic acid dianhydride and diamine is fully completed.

Polyimide is yielded by imidizing polyamide acid by applying either method of thermal curing or chemical curing. In the thermal curing method, imidization reaction is promoted by heating without using a dehydrating and cyclizing agent. In the chemical curing method, a dehydrating and cyclizing agent represented by acid anhydride such as acetic anhydride, and catalysts represented by tertiary amines such as isoquinoline, β-picoline, and pyridine act upon an organic solvent solution of polyamide acid. The combination of the above two methods is also procticable. The condition of imidizing reaction may depend on the kind of polyamide acid, thickness of a film, and selection of either thermal curing method or chemical curing method.

A polyamide acid composition, a precursor of polyimide, is yielded by adding inorganic or organic metallic compounds and inhibitors for gelation in any stage of the above producing processes of polyamide acid. The polyimide film of the present invention is produced by casting a polyamide acid composition comprising an organic solvent solution of polyamide acid, inorganic or organic metallic compounds, and preferably catalyst and a dehydrating and cyclizing agent, in the form of partially-cured "gel film" and then treating it by a final curing process.

Concretely, a method of executing chemical curing process is described below. First, a polyamide acid composition is cast over a casting surface to form a film. The film is heated up slowly at about 100° C. and then the cast film is transformed into a polyamide-acid-polyimide gel film by activating a dehydrating and cyclizing agent and catalyst.

It should be understood that the term "gel film" used herein means polymer sheet of polyamide acid containing volatile matter consisting mainly of solvent, which gels and swells into rubber form.

The obtained gel film is dried and then water, residual solvent, and dehydrating and cyclizing agent are removed from the film, thus polyamide acid is completely transformed into polyimide.

As the gel film contains much solvent and the like, such solvent and the like should be removed from the film by a drying process before a dehydrating and cyclizing process. In order to prevent the film from shrinking in the step of removing solvent with drying, or in the tenter step of continuous production method, it is preferable that both ends of the gel film be secured with tenter clips or pins. In this case, the film can be dried under relatively mild drying condition in order to prevent polyamide acid from being fully transformed completely into polyimide.

In order to dry and imidize the film at the same stage, it is preferable that the film be heated at a high temperature for a short period of time. Concretely, it is preferable that the film is heated at 200 to 550° C. for 15 to 400 seconds. The thinner the film is, the lower the heating temperature is controlled.

Material used for preparing a polyamide acid composition of the present invention is cited below.

Organic diamines used in the present invention are, for example,: 4,4'-diaminodiphenyl propane, 4,4'-diaminodiphenyl ethane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenyl ether, 1,5-diaminonaphthalene, 4,4'-diaminodiphenyldiethyl silane, 4,4'-diamino-diphenyl silane, 4,4'-diaminodiphenylethyl phosphine oxide, 4,4'-diaminodiphenyl-N-methylamine, 4,4'-diaminodiphenyl-N-phenylamine, p-phenylenediamine, 1,3-diaminobenzene, 1,2-diaminobenzene, m-phenylene diamine, 4,4'-diaminodiphenyl methane, 2,6-diamino pyridine, and 3,3-dimethoxy benzidine, and the like, which can be used alone or in combinations of two kinds or more. Among those organic diamines, paraphenylene diamine and 4,4'-diaminodiphenyl ether are preferably used in particular.

Organic tetracarboxylic acid dianhydrides used in the present invention are, for example,: pyromellitic acid dianhydride, 2,3,6,7-naphthalene tetracarboxylic acid dianhydride, 3,3',4,4'-biphenyltetracarboxylic acid dianhydride, 1,2,5,6-naphthalene tetracarboxylic acid dianhydride, 2,2',3,3',-biphenyltetracarboxylic acid dianhydride, 3,3',4,4'-benzophenon tetracaboxylic dianhydride, 2,2-bis(3,4-dicarboxyphenyl) propane dianhydride, 3,4,9,10-perylenetetracarboxylic acid dianhydride, bis(3,4-dicarboxyphenyl) propane dianhydride, 1,1-bis(2,3-dicarboxyphenyl) ethane dianhydride, 1,1-bis(3,4-dicarboxyphenyl) ethane dianhydride, bis(2,3-dicarboxy-phenyl) methane dianhydride, bis(3,4-dicarboxyphenyl) methane dianhydride, oxydiphthalic acid dianhydride, bis(3,4-dicarboxyphenyl) sulfonic acid dianhydride, bis(3,4-dicarboxyphenyl) sulfonic acid dianhydride, and the like, which can be used alone or in combinations of two kinds or more. Among those organic tetracarboxylic acid dianhydrides, pyromellitic acid dianhydride and biphenyltetracarboxylic acid dianhydride are preferably used in particular.

Organic solvent used in the present invention are, for example,: N,N-dimethylformamide, N-N-diethylacetamide, dimethylsulfoxide, N-methyl-2-pyrolidone, tetramethyl urea, dimethyl sulfone, hexamethylphosforamide, tetramethylene sulfone, and the like, which can be used alone or in combinations of two kinds or more. Since it is essential that organic solvent be effective in the dissolution of organic diamines, organic tetracarboxylic acid dianhydride, and polyamide acid, N,N-dimethylformamide, N,N-dimethylacetoamide, N,N-dimethyl sulfoxide, and N-methyl-2-pyrolidone are preferably used alone or in the combinations of two kinds or more. Any of the above-cited organic solvents may be used in combination with poor solvents such as benzene, benzonitrile, dioxane, and the like. It is preferable that the concentration of solid polyimide be 10 to 35 wt % of the solvent, because the suggested concentration yields the optimum molecular weight of polyamide acid.

In the case of executing imidization process by chemical curing method, dehydrating and cyclizing agents added to a polyamide acid composition according to the present invention are, for example,: aliphatic acid anhydride, aromatic acid anhydride, N,N'-dialkylcarbodiimide, low-aliphatic halide, halogenated low-aliphatic halide, halogenated low-aliphatic acid anhydride, arylphosphonic acid dihalide, thionyl halide, and the like, which can be used alone or in combinations of two kinds or more. Among those agents described above, aliphatic anhydrides such as acetic anhydride, propionic acid anhydride, butylic acid anhydride and the like are preferably used alone or in combination of two kinds or more.

Imidization can be promoted by jointly using catalysts and dehydrating and cyclizing agents. Catalysts used in the present invention includes aliphatic tertiary amine, aromatic tertiary amine, heterocyclic tertiary amine, and the like. It is particularly preferable that catalysts be selected from heterocyclic tertiary amines.

Metals used in the present invention includes Ti, Zr, V, Nb, Cr, Mo, Mn, Fe, Ru, Co, Rh, Ni, Pd, Cu, Ag, Zn, Si, Sn, Pb, Sb, Bi, and the like. The source of metal includes halides such as chlorides or bromides, oxides, hydroxides, carbonates, nitrates, nitrites, phosphates, sulfates, silicates, borates, condensed phosphates, and the like. It is also possible to use organometallic compounds containing organic compounds capable of forming coordinate bond with metallic atom. Organic compounds capable of forming coordinate bond with metallic atom include neutral moleculars such as diamine, diphosphine, diether, triamine, and triphosphine, organic compounds containing acetylacetonato ion, carboxylate anion and dithiocarbamate anion, and cyclic ligands such as porphyrin, or phthalocyanine, and Shiff base, which can be used alone or in combination of two kinds or more. Among a variety of metallic compounds used in the present invention, commercially available titanic organometallic compounds or the improved ones can be used. For example, alkyl titanium, aryl titanium, alkoxy titanium, ariroxy titanium, titanium acylate, or titanium chelate can be used. More specifically, titanic organic compounds cited below can be used: tetraisopropyltitanate, tetra-n-butyltitanate, tetrakis(2-ethylhexoxy) titanate, tetrastearoyl titanate, tetrakis(2-ethylhexanediolato) titanate, tetra octyleneglycol titanium, dihydroxy-bis(lactato)titanate, ammonium salt of lactate titanate, dipropoxy-bis (acetylacetonato) titanium, dibutoxytitanium-bis (octyleneglycolate), dipropoxytitanium-bis (ethylacetoacetate), dipropoxytitanium-bis(lactate), di-n-butoxytitanium-bis(triethanolaminate), tri-n-butoxytitanium monostearate, butyltitanate dimer, poly(titanium acetylacetonate) poly(tripropoxy titanium), poly(tributoxy titanium), poly(tributoxy titanium monostearate), poly (hydroxytitanium stearate), isopropyltristearoyltitanate, isopropyl tridodecylbenzenesulfonyltitanate, isopropyltris (dioctylpyrophosphate) titanate, tetraoctyl bis (ditridecylhosphite) titanate, tetra(2,2 diaryloxy methyl-1-butoxy) di(di-tridecylphosphite) titanate, bis (dioctylpyrophosphate) oxyacetatetitanate, bis (dioctylpyrophosphate)ethylene titanate, titanium stearate, propane dioxytitanium bis(ethyl acetoacetate), okis titanium bis(monoammonium oxalate), di-i-propoxy titanium di-stearate, isopropoxytri-N-ethylaminoethyl aminato titanium, tetramethyl titanate, which can be used alone or in combination of two kinds or more.

Among those titanium organometallic compounds cited above, titanic organometallic chelate compounds are preferably used, and more preferably, organometallic chelate compounds, wherein titanium atom is combined with ligand, which is at least one molecular selected from the group consisting of β-diketone, hydroxy carboxylic acid, keto-ester chelate and glycol chelate are used. These compounds are respectively stable in storage life and soluble in organic solvent solutions used in the present invention.

Inhibitors for gelation are added in the preset invention in order to suppress bridge formation or gelation between high-polymer chains resulting from formation of chemical bond between metallic atoms and functional groups of polyamide acid or polyimide. Inhibitors for gelation used in the present invention are organic compounds capable of forming coordinate bond with a variety of metallic atoms. Concretely, organic compounds used in the present invention are: acetyl acetone, 2,4-hexane-dione, 2,4-heptane-dione, 2,4-octane-dione, 3,5-heptane-dione, 3,5-octane-dione, 3,5-nonane-dione, 4,6-nonane-dione, 4,6-decane-dione, 5,7-undecane-dione, 3-methyl-2,4-pentane-dione, 3-ethyl-2,4-pentane-dione, 3-propyl-2,4-pentane-dione, 3-methyl-2,4-hexane-dione, 3-ethyl-2,4-hexane-dione, 3-propyl-2,4-hexane-dione, 3-methyl-2,4-heptane-dione, 3-ethyl-2,4-heptane-dione, 3-propyl-2,4-heptane-dione, 3-methyl-2,4-octane-dione, 3-ethyl-2,4-octane-dione, 3-propyl-2,4-octane-dione, 4-methyl-3,5-heptane-dione, 4-ethyl-3,5-heptane-dione, 4-propyl-3,5-heptane-dione, 4-methyl-3,5-octane-dione, 4-ethyl- 3,5-octane-dione, 4-propyl-3,5-octane-dione, 4-methyl-3,5-nonane-dione, 4-ethyl-3,5-nonane-dione, 5-methyl-4,6-nonane-dione, 5-ethyl-4,6-nonane-dione, 5-methyl-4,6-decane-dione, 5-ethyl-4,6-decane-dione, 6-methyl-5,7-undecane-dione, 6-ethyl-5,7-undecane-dione, benzoyl acetone, 1,3-diphenyl-1,3-propane-dione, methyl acetoacetate, ethyl acetoacetate, propyl acetoacetate, butyl acetoacetate, pentyl acetoacetate, hexyl acetoacetate, heptyl acetoacetate, octyl acetoacetate, phenyl acetoacetate, methyl 3-pentanonate, ethyl 3-pentanonate, propyl 3-pentanonate, butyl 3-pentanonate, pentyl 3-pentanonate, hexyl 3-pentanonate, heptyl 3-pentanonate, octyl 3-pentanonate, phenyl 3-pentanonate, methyl 3-hexanonate, ethyl 3-hexanonate, propyl 3-hexanonate, butyl 3-hexanonate, pentyl 3-hexanonate, hexyl 3-hexanonate, heptyl 3-hexanonate, octyl 3-hexanonate, phenyl 3-hexanonate, methyl 3-heptanonate, ethyl 3-heptanonate, propyl 3-heptanonate, butyl 3-heptanonate, octyl 3-heptanonate, phenyl 3-heptanonate, methyl 2-methyl-3-butanonate, methyl 2-ethyl-3-butanonate, methyl 2-ethyl-3-butanonate, methyl 2-propyl-3-butanonate, propyl 2-methyl-3-butanonate, butyl 2-methyl-3-butanonate, phenyl 2-methyl-3-butanonate, ethyl 2-ethyl-3-butanonate, propyl 2-ethyl-3-butanonate, phenyl 2-ethyl-3-butanonate, ethyl 2-propyl-3-butanonate, propyl 2-propyl-3-butanonate, phenyl 2-propyl-3-butanonate, methyl 2-phenyl-3-butanonate, ethyl 2-phenyl-3-butanonate, phenyl 2-phenyl-3-butanonate, methyl 3-phenyl-3-propanonate, ethyl 3-phenyl- 3-propanonate, phenyl 3-phenyl-3-propanonate, methyl 2-methyl-3-phenyl-3-propanonate, methyl 2-ethyl-3-phenyl-3-propanonate, ethyl 2-ethyl-3-phenyl-3-propanonate, methyl 2-methyl-3-pentanonate, ethyl 2-methyl-3-pentanonate, propyl 2-methyl-3-pentanonate, methyl 2-ethyl-3-pentanonate, ethyl 2-ethyl-3-pentanonate, octyl 2-ethyl-3-pentanonate, phenyl 2-ethyl-3-pentanonate, methyl 2-propyl-3-pentanonate, ethyl 2-propyl-3-pentanonate, propyl 2-propyl-3-pentanonate, octyl 2-propyl-3-pentanonate, phenyl 2-propyl-3-pentanonate, methyl 2-phenyl-3-pentanonate, ethyl 2-phenyl-3-pentanonate7 propyl 2-phenyl-3-pentanonate, octyl 2-phenyl-3-pentanonate, phenyl 2-phenyl-3-pentanonate, methyl 2-methyl-3-hexanonate, ethyl 2-methyl-3-hexanonate, propyl 2-methyl-3-hexanonate, octyl 2-methyl-3-hexanonate, phenyl 2-methyl-3-hexanonate, methyl 2-ethyl-3-hexanonate, ethyl 2-ethyl-3-hexanonate, octyl 2-ethyl-3-hexanonate, phenyl 2-ethyl-3-hexanonate, methyl 2-propyl-3-hexanonate, ethyl 2-propyl-3- hexanonate, propyl 2-propyl-3-hexanonate, octyl 2-propyl-3-hexanonate, phenyl 2-propyl-3-hexanonate, methyl 2-phenyl-3-hexanonate, ethyl 2-phenyl-3-hexanonate, propyl 2-phenyl-3-hexanonate, butyl 2-phenyl-3-hexanonate, octyl 2-phenyl-3-hexanonate, phenyl 2-phenyl-3-hexanonate, N-methyl-3-butanon amide, N-ethyl-3-butanon amide, N-propyl-3-butanon amide, N-butyl-3-butanon amide, N-octyl-3-butanon amide, anilino acetoacetate, toluidino acetoacetate, N-methyl-3-pentanon amide, N-ethyl-3-pentanon amide, N-propyl-3-pentanon amide, N-octyl-3-pentanon amide, N-phenyl-3-pentanon amide, N-methyl-3-hexanon amide, N-ethyl-3-hexanon amide, N-propyl-3-hexanon amide, N-octyl-3-hexanon amide, N-phenyl-3-hexanon amide, N-methyl-3-heptanon amide, N-ethyl-3-heptanon amide, N-propyl-3-heptanon amide, N-octyl-3-heptanon amide, N-phenyl-3-heptanon amide, N-methyl-3-phenyl-3-propanon amide, N-ethyl-3-phenyl-3-propanon amide, N-propyl-3-phenyl-3-propanon amide, N-methyl-2-methyl-3-butanon amide, malonic nitrile, 2-methyl-propiondinitrile, 2-ethyl-propiondinitrile, 2-propyl-propiondinitrile, 2-octyl-propiondinitrile, and 2-phenyl-propiondinitrile.

In addition to those cited above, organic compounds used in the present invention include didentate ligand, which forms hexacycles, pentacycles, or tetracycles in conjunction with metallic atoms. Tridentate ligand, tetradentate ligand, or pentadentate ligand may also be included. Further, it may also include large cyclic ligand such as Shiff base, porphyrin, phthalocyanine, and the like.

From the viewpoint of solubility in an organic solvent solution of polyamide acid, reactivity with a variety of metallic atoms, and costs, it is preferable that acetyl acetone, methyl acetoacetate, ethyl acetoacetate, acetoacetic anilide, malonic nitrile, or a mixture of two kinds or more of the above be used for an inhibitor for gelation.

By adding the above-referred inhibitors for gelation, inhibitors for gelation is coordinated in part of coordination site of metallic atoms formed by bonding with functional groups of polyamide acid and/or polyimide, thus making it possible to obtain a distinct effect of suppressing gelation phenomenon caused by three-dimensional bonding taking place disorderly or locally between functional groups of polyamide acid and polyimide and metallic atoms.

Next, a method of adding inorganic or organic compounds and inhibitors for gelation is described below.

A polyamide acid composition related to the present invention contains an organic solvent solution of polyamide acid, inorganic or organic compounds, and inhibitors for gelation. Basically, inorganic or organic metallic compounds and inhibitors for gelation can be added in any step during the process for producing a polyamide acid composition, a precursor of polyimide.

However, in the case of adding a variety of metallic compounds and inhibitors for gelation in an optional step during the process for synthesizing polyamide acid, it is recommended that inorganic or organic metallic compounds be added simultaneously or after adding inhibitors for gelation. If inorganic or organic metallic compounds were added and blended prior to addition of inhibitors for gelation, functional groups of polyamide acid are reacted and bonded with metallic atoms, which causes the gelation. After the gelation, it is very difficult to relax gelation generated in polyamide acid.

In the case of implementing thermal curing method, for example, there are those practical methods of adding inorganic or organic metallic compounds and inhibitors for gelation as described below, however the methods are not limited by the following methods.

1. Inhibitor for gelation is added and blended in the course of synthesizing polyamide acid, and inorganic or organic metallic compounds are added after polyamide acid is completely synthesized.
2. Inhibitors for gelation are added and blended after polyamide acid is completely synthesized, and inorganic or organic metallic compounds are blended with the inhibitors for gelation or added and blended after adding the inhibitors for gelation.

In the case of implementing chemical curing method, there are those practical methods of adding inorganic or organic metallic compounds and inhibitors for gelation as described below. However, the methods are not limited by the following methods.

1. Inhibitors for gelation are added and blended in the course of synthesizing polyamide acid, and inorganic or organic metallic compounds are added to an organic solvent solution of polyamide acid alone or blended with curing agents.
2. Inhibitors for gelation are added to and blended in the solution in which polyamide acid is completely synthesized, and inorganic or organic metallic compounds are added to said solution alone or they are added to the solution after being mixed in curing agents(dehydrating and cyclizing agents and catalysts).
3. After polyamide acid is synthesized, inhibitors for gelation are added to and blended in curing agents (dehydrating and cyclizing agents and catalysts), and then the blend is added to an organic solvent solution of polyamide acid, and inorganic or organic metallic compounds are added to the solution alone or blended in the curing agents.

Generally, in the imidization process of the chemical curing method, a dehydrating and cyclizing agent and catalyst work to promote imidization reaction and hardening the above blended solution. Furthermore, because of the coordinate bond of metallic compounds, the gelation of the solution tends to take place by adding metallic compounds to a dehydrating and cyclizing agent and catalyst. However, by the addition of inhibitor for gelation of the present invention, the inhibitor for gelation is coordinated in metallic atoms, therefore it prevents the gelation and makes it possible to realize uniform imidization.

The proportion of each component in the polyamide acid composition of the present invention varies from molding methods and conditions. Solid concentration of polyamide acid in an organic solvent solution of polyamide acid is 8 wt % to 35 wt %, preferably 12.5 wt % to 27.5 wt %.

The proportion of dehydrating and cyclizing agent added to the solution of polyamide acid is about 0.5 to 10 mol volume per a repeating unit of polyamide acid, preferably 2 to 6 mol volume, whereas the proportion of catalyst is about 0.01 to 4 mol volume, preferably 0.1 to 2 mol volume per a repeating unit of polyamide acid.

It is preferable that inorganic or organic metallic compounds be added to the organic solvent solution of polyamide acid in order that concentration of metallic atoms become 0.001 wt % to 1 wt % of polyimide film. Alternatively, it is preferable that proportion of metallic atoms should be 0.005 wt % to 1 wt % against a polyamide acid composition. As reactivity with polyamide acid and polyimide differs depending on the kind of metallic compound added, optimum range of metallic concentration may vary within the above-specified ranges.

Addition of inorganic or organic metallic compounds to organic solvent solution of polyamide acid provides crosslinking positions to main-chains of polyimide, so that the produced polyimide may have distinctive properties. For example, in the case of adding titanic metallic compounds, adhesive strength of polyimide film, particularly, adhesive strength of polyimide film after aging is promoted, and polyimide film can obtain heat resistance property. However, if metallic compounds were added to a polyamide acid composition, three-dimensional bond can be generated disorderly or locally between functional groups of polyamide acid or polyimide and metallic atoms. At the result, the gelation takes place. Once the gelation occurs, it raises problem on the cast appearance and adversely affects physical properties of the film. Therefore, in the present invention, inhibitors for gelation are added to prevent the gelation and to fully materialize effects of improving characteristics of metallic compounds added.

Although there is no restriction on the volume of inhibitor for gelation of the present invention, it is preferable that the mol volume of inhibitor for gelation corresponds to 0.01 to 10000 times the mol volume of metallic atoms, more preferably, 0.1 to 5000 times, and most preferably, 1 to 200 times.

If the inhibitor for gelation was added too little, three-dimensional bond will be generated disorderly or locally between the metallic atoms and functional groups of polyamide acid, and the gelation of organic solvent solution of polyamide acid takes place, which makes it difficult to cast the solution to form a film.

Conversely, if the inhibitor for gelation was too much, no bond between metallic atoms and functional groups of polyamide acid can be produced at all, which makes it difficult to improve physical properties of polyimide film such as adhesiveness, inductivity, and glass transition (Tg) characteristic, and the like. Further, it will cause the polyimide film to bear color and viscosity of polyamide acid or polyamide acid solution to be lowered, thus making it difficult to produce a polyimide film having a desired uniform thickness. In particular, thicker polyimide film will incur the above problem. Further, solid concentration of polyamide acid present in the organic solvent solution of polyamide acid will also be lowered, which causes viscosity of the solution to be lowered and incurs handling inconvenience.

It was confirmed via a variety of analytical arts that the upper-most layer of a polyimide film directly adhered to adhesive agent was peeled off from the main body of the polyimide film in a measuring test of adhesive strength, which is one of the characteristic tests of a film. This indicates that the measured value of adhesive strength represents strength in the direction of thickness of a polyimide film.

The novel polyimide film of the present invention produced from a polyamide acid composition with inorganic or organic metallic compounds and inhibitors for gelation added has been found to have excellent adhesive strength as mentioned above, thus it indicates that the strength in the thickness direction of polyimide film has been promoted. Accordingly, it is inferred that adding inorganic or organic metallic compounds, the generated transformation of polymer morphology on which metallic atoms work as a cross-linking point in the imidization process, and bonding in the direction of thickness of a polyimide film is strengthened. It is also inferred that the addition of inhibitors for gelation relaxes reaction of functional groups of polyamide acid and/or polyimide with metallic atoms, and permits provisional imidization while preventing the gelation, thus making it possible to produce uniform and highly-crystalline polyimide film with a variety of distinctive physical properties.

As inhibitors for gelation are added to a polyamide acid composition of the present invention, no gelation takes place, thus making it possible to easily cast organic solvent solution of polyamide acid into film form. The polyimide film treated by heat is good in appearance, and can easily and fully exhibit the effect of adding a variety of inorganic or organic metallic compounds in order to improve or provide a variety of physical characteristics such as adhesiveness at high temperature, electrical conductivity, heat-resistance, mechanical strength at high temperature, promotion of Tg value, and decrease of weight at high temperature, and the like. Accordingly, the improved polyamide acid composition related to the present invention can be used for a variety of electrical materials such as electrical insulating film, flexible printed circuit board, and the like.

The addition of inorganic or organic metallic compounds to polyamide acid in the imidization process causes the transformation of polymer morphology, in which the metallic atoms work as the cross-linking points as described above, and bonding of polyimide film is considered to be strengthened and hydrolytic resistance of mechanical strength of the film as well as adhesive strength after aging are considered to be improved. "Mechanical strength" used herein means tear strength-propagation or tensile strength.

A laminate used for a flexible printed circuit board comprising the polyimide film achieved by the above-described methods can be produced by applying known arts. An example of the production method of a triple-layer laminate is described below.

A triple-layer laminate can be made by coating upper surface of the polyimide film of the present invention with adhesive agent or laminating sheet-form adhesive agent thereon, then laminating copper foil with adhesive agent, and curing the adhesive agent at a suitable temperature.

In this case of the triple-layer laminate, a metallic foil such as a copper foil is bonded to a substrate via a layer of adhesive agent. Any of conventionally known adhesive agents can be used. Concretely, epoxy resin, polyamide resin, phenol resin, acrylic resin, polyimide resin, and rubber resin can be used alone or can be used by being blended with solvent under a variety of proportions. Further, as needs arise, any additive such as curing agent, curing accelerator, antioxidant, or UV absorber, may also be added to the adhesive agent.

In the case of using adhesive solution, a polyimide film is slit by a predetermined width, and then adhesive solution is cast over the film by a bar-coater or a comma-coater to form 1 to 50 $\mu$m of thick adhesive layer. The adhesive-coated film is dried at 50 to 200° C. for 10 to 600 seconds to eliminate organic solvent from the adhesive solution.

After that, adhesive-coated polyimide film is laminated with a copper foil (rolled copper foil or electrolyzed copper foil) at 50 to 200° C., and then adhesive agent is cured in condition of temperature and time suitable for curing the adhesive agent. In the case of using adhesive sheet, polyimide film is laminated with an adhesive sheet at 50 to 200° C. after removing a protective layer of the sheet. Then, adhesive surface laminated on polyimide film is laminated with copper foil (rolled copper foil or electrolyzed copper foil) at 50 to 200° C., and then the triple-layer laminate is thermally cured in condition of temperature and time suitable for curing the adhesive agent.

Next, a method of producing a double-layer laminate (metal-covered polyimide film) having vacuum-evaporated metallic layer directly bonded to the polyimide film of the present invention without using adhesive agent is described below.

First, using vapor-depositing method or sputtering method, a thin metallic layer is formed by vacuum evaporation of metals such as noble metals, alkali earth metals, or transition metals (such as copper, cobalt, nickel, chromium, or titanium for example) on the surface of the polyimide film containing organic metallic compound. It is preferable that the vacuum evaporated metallic layer be a single-material layer with a thickness of about 500 to 5000 Å.

In the above vacuum evaporation method, it is preferable that vacuum pressure be in a range of $1 \times 10^{-10}$ to $5 \times 10^{-2}$ Torr and evaporation temperature be in a range of 20° C. to 200° C.

Next, a metallic plate layer is formed on the above-referred vacuum-evaporated thinner metallic layer by applying electron-plating method to form a thicker metallic layer, thus metal-clad polyimide film is obtained.

The thicker metallic layer be made of any of those metals such as copper, nickel, chrome, cadmium, cobalt, palladium, platinum, aluminum, zinc, tin, lead, gold, silver, or the like, which has a thickness of 10 to 70 $\mu$m, preferably, 10 to 35 $\mu$m.

The above-referred electron-plating method is executed by immersing anode and cathode which is to be plated as a film member in the opposite side of anode in metallic-ion-containing solution, and then direct current is transmitted between both electrodes to form a metal-clad layer on the film.

In addition to the above-referred methods, there is another useful method of forming a metallic layer on a polyimide film.

In this method, a metallic tie-coat layer made of chromium, nickel, or titanium is formed on the surface of the polyimide film. The formed metallic tie-coat layer has a thickness of 10 to 300 Å and promotes an effect of bonding the above-referred vacuum evaporated metallic layer onto the polyimide film.

The polyimide film composing a double-layer laminate and a triple-layer laminate can be treated in gas plasma before spreading adhesive agent or laminating adhesive sheet onto the surface of the polyimide film or before vacuum evaporating metal on the surface of the polyimide film.

It is preferable that vacuum plasma or atmospheric plasma treatment be used as gas plasma treatment.

Gas plasma can be formed by the following gas: inert gas such as helium, argon, krypton, xenon, neon, radon, and nitrogen, oxygen, atmosphere, nitrogen, carbon monoxide, carbon dioxide, carbon tetrachloride, chloroform, hydrogen, ammonia, carbon tetrafluoride, trichlorofluoroethane, or trifluoromethane, or conventionally known fluoride gas, or blend of the above gases. Oxygen, argon, ammonia, and blend of these gases are preferably used.

Since a polyimide film added with metallic compound can fully exhibit improved physical properties and added useful characteristic, the double-layer laminate and the triple-layer laminate containing said polyamide film can be used as electric/electronic equipment and appliances requiring distinguished physical properties such as adhesiveness at high temperature, electrical conductivity, heat-resistance, and mechanical strength at high temperature. In particular, both the double and triple-layer laminates can be preferably used for flexible printed circuit boards.

Next, a polyimide-molding produced by a polyamide acid composition of the present invention is described below. Generally, since polyimide resin is insoluble to organic solvent and thermally infusible, powdered polyimide resin is produced, stamped, and then treated by heat to produce thick polyimide molding.

Conventionally-known powdered polyimide resin can be obtained by applying the method disclosed in the Japanese Patent Publication No. 39-30060, wherein a polyamide acid composition comprising mainly of polyamide acid yielded by reacting aromatic tetracarboxylic acid dianhydride and aromatic diamine in an organic solvent solution was thermally dehydrated and cyclized to obtain powdered polyimide resin. Powdered polyimide resin can be also obtained by applying methods disclosed in the Japanese Patent Publications No. 39-9078 and No. 61-252228 and the Laid-Open Japanese Patent Publication No. 61-26926. Powdered polyimide resin is pressed and at the same time or after being pressed, it is thermally treated in the pressure-free condition to obtain polyimide molding related to the invention.

In addition to a variety of distinctive physical properties of polyimide, the polyimide molding can effectively exhibit mechanical characteristics such as strength and toughness, by the use of a polyamide acid composition containing inhibitor for gelation. Therefore, the polyimide molding is widely used as mechanism elements such as slide members and automobile parts, office appliance, electrical and electric equipment, apparatus of aerospace sector and atomic sector, and general industrial machinery, and the like.

As described above, by adding of inhibitor for gelation, the polyamide acid composition, polyimide film and polyimide-film molding containing metal can be produced without any gelation. They are good in appearance and can fully exhibit practical effects of adding metallic compound. Further, they can be used for a variety of electric/electronic component parts such as electrically insulating film and flexible printed circuit boards.

Having now fully described the invention, it will be apparent to one of ordinary skill in the art that various changes and modifications can be made thereto without departing from the spirit or scope of the present invention as set forth herein.

EXAMPLES

The present invention will be more clearly understood by referring the Examples below. However, the Examples should not be construed to limit the invention in any way.

Abbreviations shown in the Examples represent the following:

PMDA . . . pyromellitic acid dianhydride;
ODA . . . 4,4'-diamino-diphenyl ether;
DMF . . . dimethyl formamide;
IQ . . . isoquinoline;
AA . . . acetic anhydride;

Comparative Example 1

A solution containing 9 g of DMF, 2 g of IQ, and 17 g of AA was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 1

A solution containing 9 g of DMF, 2 g of IQ, and 17 g of AA and 15 g of DMF solution containing 0.05 g titanium oxide (II) acetylacetonato and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. By for 3 minutes to cure the film. The cured film was then removed from the frame.

Comparative Example 2

A solution containing 9 g of DMF, 2 g of IQ, and 17 g of AA and 15 g of DMF solution containing 0.05 g of titanium oxide(II) acetylacetonato was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution of polyamide acid took place, so that the solution could not be cast over the aluminum foil to form a film.

Comparative Example 3

A solution containing 9 g of DMF, 2 g of IQ, and 17 g of AA and 15 g of DMF solution containing 0.07 g of iron chloride(III) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the coma-coater to form a film. However, the gelation of DMF solution of polyamide acid took place, so that the solution could not be cast over the aluminum foil to form a film.

Example 2

A solution containing 9 g of DMF, 2 g of IQ, and 17 g of AA and 15 g of DMF solution containing 0.07 g of iron chloride(III) and 4 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 3

A solution containing 9 g of DMF, 2 g of IQ, and 17 g of AA and 15 g of DMF solution containing 0.08 g of stannic chloride(II) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 4

A solution containing 9 g of DMF, 2 g of IQ, and 17 g of AA and 15 g of DMF solution containing 0.08 g of stannic chloride(II) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 4

A solution containing 9 g of DMF, 2 g of IQ, and 17 g of AA and 15 g of DMF solution containing 0.05 g of zirconium oxychloride(IV) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 5

A solution containing 9 g of DMF, 2 g of IQ, and 17 g of AA and 15 g of DMF solution containing 0.05 g of zirconium oxychloride(IV) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 5

A solution containing 9 g of DMF, 2 g of IQ, and 17 g of AA and 15 g of DMF solution containing 0.30 g of cobalt(II) acetylacetonato and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 6

A solution containing 9 g of DMF, 2 g of IQ, and 17 g of AA and 15 g of DMF solution containing 0.30 g of cobalt(II) acetylacetonato was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 6

A solution containing 9 g of DMF, 2 g of IQ, and 17 g of AA and 15 g of DMF solution containing 0.20 g of chromium acetate(III) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 7

A solution containing 9 g of DMF, 2 g of IQ, and 17 g of AA and 15 g of DMF solution containing 0.20 g of chromium acetate(III) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 7

A solution containing 9 g of DMF, 2 g of IQ, and 17 g of AA and 15 g of DMF solution containing 0.07 g of molybdenum oxide acetylacetonato(VI) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 8

A solution containing 9 g of DMF, 2 g of IQ, and 17 g of AA and 15 g of DMF solution containing 0.07 g of molybdenum oxide acetylacetonato(VI) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 8

A solution containing 9 g of DMF, 2 g of IQ, and 17 g of AA and 15 g of DMF solution containing 0.10 g of lead carbonate(II) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 9

A solution containing 9 g of DMF, 2 g of IQ, and 17 g of AA and 15 g of DMF solution containing 0.10 g of lead carbonate(II) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 9

A solution containing 9 g of DMF, 2 g of IQ, and 17 g of AA and 15 g of DMF solution containing 0.20 g of zinc chloride(II) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 10

A solution containing 9 g of DMF, 2 g of IQ, and 17 g of AA and 15 g of DMF solution containing 0.20 g of zinc chloride(II) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 10

A solution containing 9 g of DMF, 2 g of IQ, and 17 g of AA and 15 g of DMF solution containing 0.20 g of copper chloride(I) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 11

A solution containing 9 g of DMF, 2 g of IQ, and 17 g of AA and 15 g of DMF solution containing 0.20 g of copper chloride(I) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

The casting tests of organic solvent solutions of polyamide acid obtained in Examples 1 to 10 and Comparative Examples 1 to 11 were conducted, based on the solution obtained in Comparative Example 1. The casting test used herein is a test to check whether or not the solution can be cast to form a film with an even thickness. Results of the tests are shown in Table 1, wherein ○ means that the solution could be cast, Δ means that the solution could be cast but the partial gelation of the solution took place, and × means that the solution could not be cast. In addition, the appearance tests of the polyimide films obtained in Examples 1 to 10 and Comparative Examples 1 to 11 were conducted by the use of 30×30 an of polyimide films, based on the film obtained in Comparative Example 1.

The appearance test used herein is a test to check whether or not any black spots can be found on a surface of the film. However, the appearance tests of the films which could not be cast were not conducted. Results of the tests are shown in Table 1, wherein ○ means that one or more black spots could be found and × means that no black spots could not be found at all.

of about 450° C. for 3 minutes to cure the film. The cured film was then removed from the frame.

Example 11

A solution containing 9 g of DMF, 2 g of IQ, and 17 g of AA and 15 g of DMF solution containing 0.05 g of titanium oxide(II)acetylacetonato and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the

TABLE 1

| | ADDITIVES | | CASTING | APPEARANCE |
|---|---|---|---|---|
| | METALLIC COMPOUND | ACETYLACETONE | TEST | TEST |
| COMPARATIVE EXAMPLE 1 | — | X (not included) | ○ | ○ |
| EXAMPLE 1 | titanium oxide(II)acetylacetonato | ○ (included) | ○ | ○ |
| COMPARATIVE EXAMPLE 2 | titanium oxide(II)acetylacetonato | X | X | |
| EXAMPLE 2 | iron chloride | ○ | ○ | ○ |
| COMPARATIVE EXAMPLE 3 | iron chloride | X | X | |
| EXAMPLE 3 | stannic chloride | ○ | ○ | ○ |
| COMPARATIVE EXAMPLE 4 | stannic chloride | X | X | |
| EXAMPLE 4 | zirconium oxychloride | ○ | ○ | ○ |
| COMPARATIVE EXAMPLE 5 | zirconium oxychloride | X | X | |
| EXAMPLE 5 | cobalt acetylacetonato | ○ | ○ | ○ |
| COMPARATIVE EXAMPLE 6 | cobalt acetylacetonato | X | X | |
| EXAMPLE 6 | chromium acetate | ○ | ○ | ○ |
| COMPARATIVE EXAMPLE 7 | chromium acetate | X | X | |
| EXAMPLE 7 | molybdenum oxide acetylacetonato | ○ | ○ | ○ |
| COMPARATIVE EXAMPLE 8 | molybdenum oxide acetylacetonato | X | X | |
| EXAMPLE 8 | lead carbonate | ○ | ○ | ○ |
| COMPARATIVE EXAMPLE 9 | lead carbonate | X | X | |
| EXAMPLE 9 | zinc chloride | ○ | ○ | ○ |
| COMPARATIVE EXAMPLE 10 | zinc chloride | X | X | |
| EXAMPLE 10 | copper chloride | ○ | ○ | ○ |
| COMPARATIVE EXAMPLE 11 | copper chloride | X | X | |

Comparative Example 12

A solution containing 9 g of DMF, 2 g of IQ, and 17 g of AA and 15 g of DMF solution containing 0.01 g of titanium oxide(II)acetylacetonato was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 13

A solution containing 9 g of DI, 2 g of IQ, and 17 g of AA and 15 g of DMF solution containing 0.05 g of titanium oxide(II)acetylacetonato was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 14

A solution containing 9 g of DMF, 2 g of IQ, and 17 g of AA and 15 g of DMF solution containing 0.1 g of tri-n-bytoxytitanium monostearate (TBSTA, a product of NIPPON SODA CO., LTD.) was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foal and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 12

A solution containing 9 g of DMF, 2 g of IQ, and 17 g of AA and 15 g of DMF solution containing 0.1 g of tri-n-bytoxytitanium monostearate (TBSTA, a product of NIPPON SODA CO., LTD.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 13

A solution containing 9 g of DMF, 2 g of IQ, and 17 g of AA and 15 g of DMF solution containing 0.5 g of tri-n-bytoxytitanium monostearate (TBSTA, a product of NIPPON SODA CO., LTD.) and 3 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 15

A solution containing 9 g of DMF, 2 g of IQ, and 17 g of AA and 15 g of DMF solution containing 0.5 g of tri-n-bytoxytitanium monostearate (TBSTA, a product of NIPPON SODA CO., LTD.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 16

A solution containing 9 g of DMF, 2 g of IQ, and 17 g of AA and 15 g of DMF solution containing 0.5 g of tri-n-bytoxytitanium monostearate (TBSTA, a product of NIPPON SODA CO., LTD.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 14

A solution containing 9 g of DMF, 2 g of IQ, and 17 g of AA and 15 g of DMF solution containing 0.1 g of dipropoxy-bis(acetylaceonato) titanium (TC-100, a product of MATSUMOTO CHEMICAL INDUSTRIES CO., Ltd.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 17

A solution containing 9 g of DMF, 2 g of IQ, and 17 g of AA and 15 g of DMF solution containing 0.1 g of dipropoxy-bis(acetylaceonato) titanium (TC-100, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 15

A solution containing 9 g of DMF, 2 g of IQ, and 17 g of AA and 15 g of DMF solution containing 0.5 g of bis (dioctylpyrophosphate) ethylenetitanate (KR-238S, a product of Ajinomoto Co., Inc.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 18

A solution containing 9 g of DMF, 2 g of IQ, and 17 g of AA and 15 g of DMF solution containing 0.5 g of bis (dioctylpyrophosphate) ethylenetitanate (KR-238S, a product of Ajinomoto Co., Inc.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 16

A solution containing 9 g of DMF, 2 g of IQ, and 17 g of AA and 15 g of DMF solution containing 0.05 g of tetraisopropyltitanate (TA-10, a product of MATSUMOTO CHEMICAL INDUSTRIES CO., Ltd.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 19

A solution containing 9 g of DMF, 2 g of IQ, and 17 g of AA and 15 g of DMF solution containing 0.05 g of tetraisopropyltitanate (TA-10, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 17

A solution containing 9 g of DMF, 2 g of IQ, and 17 g of AA and 15 g of DMF solution containing 0.08 g of tetra-n-butyltitanate polymer (B-4, a product of NIPPON SODA CO., LTD.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 20

A solution containing 9 g of DMF, 2 g of IQ, and 17 g of AA and 15 g of DMF solution containing 0.08 g of tetra-n-butyltitanate polymer (B-4, a product of NIPPON SODA CO., LTD.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 18

A solution containing 9 g of DMF, 2 g of IQ, and 17 g of AA and 15 g of DMF solution containing 0.05 g of bis (dioctylpyrophosphate) oxyacetatetitanate (KR-138S, a product of Ajinamoto Co., Inc.) and 1 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 19

A solution containing 9 g of DMF, 2 g of IQ, and 17 g of AA and 15 g of DMF solution containing 0.1 g of bis (dioctylpyrophosphate) oxyacetatetitanate (KR-138S, a product of Ajinomoto Co., Inc.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the coma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 21

A solution containing 9 g of DMF, 2 g of IQ, and 17 g of AA and 15 g of DMF solution containing 0.05 g of bis (dioctylpyrophosphate) oxyacetatetitanate (KR-138S, a product of Ajinomoto Co., Inc.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Example 20

A solution containing 9 g of DMF, 2 g of IQ, and 17 g of AA and 15 g of DMF solution containing 0.2 g of tri-n-butoxytitanium monostearate (TBSTA, a product of NIPPON SODA CO., LTD.) and 4 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 21

A solution containing 9 g of DMF, 2 g of IQ, and 17 g of AA and 15 g of DMF solution containing 0.1 g of butyltitanate dimer (TA-22, a product of MATSUMOTO CHEMICAL INDUSTRIES CO., Ltd.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 22

A solution containing 9 g of DMF, 2 g of IQ, and 17 g of AA and 15 g of DMF solution containing 0.2 g of tetra-n-butyltitanate (TA-25, a product of MATSUMOTO CHEMICAL INDUSTRIES CO., Ltd.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 23

A solution containing 9 g of DMF, 2 g of IQ, and 17 g of AA and 15 g of DMF solution containing 0.2g of tetrakis (2-ethylhexoxy) titanate (TA-30, a product of MATSUMOTO CHEMICAL INDUSTRIES Co., Ltd.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 22

A solution containing 9 g of DMF, 2 g of IQ, and 17 g of AA and 15 g of DMF solution containing 0.2 g of tri-n-butoxytitanium monostearate (TBSTA, a product of NIPPON SODA CO., LTD.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 23

A solution containing 9 g of DMF, 2 g of IQ, and 17 g of AA and 15 g of DMF solution containing 0.1 g of butyltitanate dimer (TA-22, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 24

A solution containing 9 g of DMF, 2 g of IQ, and 17 g of AA and 15 g of DMF solution containing 0.2 g of tetra-n-butyltitanate (TA-25, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 25

A solution containing 9 g of DMF, 2 g of IQ, and 17 g of AA and 15 g of DMF solution containing 0.2 g of tetrakis (2-ethlhexoxy) titanate (TA-30, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 26

A solution containing 9 g of DMF, 2 g of IQ, and 17 g of AA and 15 g of DMF solution containing 0.1 g of butyltitanate dimer (TA-22, a product of MATSUMOTO CHEMICAL INDUSTRIES CO., Ltd.) and 0.5 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 24

A solution containing 9 g of DMF, 2 g of IQ, and 17 g of AA and 15 g of DMF solution containing 0.36 g of ammonium salt of lactate titanate (TC-300, a product of MATSUMOTO CHEMICAL INDUSTRIES CO., Ltd.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 25

A solution containing 9 g of DMF, 2 g of IQ, and 17 g of AA and 15 g of DMF solution containing 0.15 g of dihydroxy-bis(lactato)titanate (TC-310, a product of MATSUMOTO CHEMICAL INDUSTRIES CO., Ltd.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 26

A solution containing 9 g of DMF, 2 g of IQ, and 17 g of AA and 15 g of DMF solution containing 0.15g of dipropoxytitanium-bis(triethanolaminate) (TC-400, a product of MATSUMOTO CHEMICAL INDUSTRIES CO., Ltd.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 27

A solution containing 9 g of DMF, 2 g of IQ, and 17 g of AA and 15 g of DMF solution containing 0.32 g of isopropyltris(dioctylpyrophosphate) titanate (K-38S, a product of Ajinomoto Co., Inc.) and 2 g of acetylacetone was added to 80.0 g of DMF solution containing 15 wt % of solid content of polyamide acid (PMDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Example 28

A solution containing 9 g of DMF, 2 g of IQ, and 17 g of AA and 15 g of DMF solution containing 0.27 g of isopropyl tridodecylbenzenesulfo nyltitanate (KR-9SA, a product of Ajinomoto Co., Inc.) and 2 g of acetylacetone was added to 80.0 g of DMF solution containing 15 wt % of solid content of polyamide acid (PNDA and ODA) with stirring and cooling at the temperature of 0° C. or less. The mixed solution was centrifuged and deformed, and then cast over an aluminum foil by the comma-coater to form a film. The film on the aluminum foil was heated at the temperature of about 100° C. for 3 minutes in a hot-air oven. After that, the film was peeled from the aluminum foil and then fixed on a frame. The film on the frame was heated at the temperature of about 250° C. for 3 minutes in a hot-air oven and then heated at the temperature of about 450° C. for 3 minutes to cure the film. The cured film was then removed from the frame.

Comparative Example 27

A solution containing 9 g of DMF, 2 g of IQ, and 17 g of AA and 15 g of DMF solution containing 0.36 g of ammonium salt of lactate titanate (TC-300, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 28

A solution containing 9 g of DMF, 2 g of IQ, and 17 g of AA and 15 g of DMF solution containing 0.15 g of dihydroxy-bis(lactate)titanate (TC-310, a product of MATSUMOTO CHEMICAL INDUSTRIES Co., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 29

A solution containing 9 g of DMF, 2 g of IQ, and 17 g of AA and 15 g of DMF solution containing 0.15 g of dipropoxytitanium-bis(triethanolaminate) (TC-400, a product of MATSUMOTO CHEMICAL INDUSTRIES CO., Ltd.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 30

A solution containing 9 g of DMF, 2 g of IQ, and 17 g of AA and 15 g of DMF solution containing 0.32 g of isopropyltris(dioctylpyrophosphate) titanate (KR-38S, a product of Ajinomoto Co., Inc.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Comparative Example 31

A solution containing 9 g of DMF, 2 g of IQ, and 17 g of AA and 15 g of DMF solution containing 0.27 g of isopropyl tridodecylbenzenesulfo titanate (KR-9SA, a product of Ajinomoto Co., Inc.) was added to 80.0 g of DMF solution containing 15 wt % of solid content of polyamide acid (PMDA and ODA) with stirring and cooling at the temperature of 0° C. or less. The mixed solution was centrifuged and deformed, and then it was tried to be cast over an aluminum foil by the comma-coater to form a film. However, the gelation of DMF solution took place, so that the solution could not be cast over the aluminum foil to form a film.

Based on the solution obtained in Comparative Example 1, the casting tests and the appearance tests of organic solvent solutions of polyamide acid obtained in Examples 11 to 28 and Comparative Example 12 to 31 were conducted as was done in Examples 1 to 10 and Comparative Examples 1 to 11. In the case that the organic solvent solution of polyamide acid could not be cast over to form a film because of the gelation, the casting tests were not conducted. Results of the tests are shown in Table 2 and Table 3.

TABLE 2

| TITANIUM COMPOUND | | TITANIUM CONCENTRATION (wt %) | VOLUME OF ACETYLACETONE ADDED (g) | CASTING TEST | APPEARANCE TEST | ADHESIVE STRENGTH (kg/cm) | |
|---|---|---|---|---|---|---|---|
| | | | | | | INITIAL VALUE | AFTER AGING |
| | COMPARATIVE EXAMPLE 1 | — | — | ○ | ○ | 0.90 | 0.50 |
| titanium oxide acetylacetonate | EXAMPLE 11 | 0.06 | 1 | ○ | ○ | 0.90 | 0.95 |
| | COMPARATIVE EXAMPLE 12 | 0.01 | — | Δ | X | 0.85 | 0.60 |
| | COMPARATIVE EXAMPLE 13 | 0.06 | — | X | X | — | — |
| tri-n-butoxytitanium monostearate | EXAMPLE 12 | 0.05 | 1 | ○ | ○ | 0.90 | 1.00 |
| | EXAMPLE 13 | 0.25 | 3 | ○ | ○ | 0.95 | 0.95 |
| | COMPARATIVE EXAMPLE 14 | 0.05 | — | Δ | X | 0.88 | 0.75 |
| | COMPARATIVE EXAMPLE 15 | 0.25 | 1 | X | X | — | — |
| | COMPARATIVE EXAMPLE 16 | 0.25 | — | X | X | — | — |
| dibutoxytitanium-bis(octyleneglycolate) | EXAMPLE 14 | 0.07 | 1 | ○ | ○ | 0.90 | 0.95 |
| | COMPARATIVE EXAMPLE 17 | 0.07 | — | X | X | — | — |
| bis(dioctylpyrophostate) ethylenetitanate | EXAMPLE 15 | 0.02 | 1 | ○ | ○ | 0.88 | 0.89 |
| | COMPARATIVE EXAMPLE 18 | 0.02 | — | X | X | — | — |
| tetraisopropyltitanate | EXAMPLE 16 | 0.06 | 1 | ○ | ○ | 0.96 | 0.95 |
| | COMPARATIVE EXAMPLE 19 | 0.06 | — | X | X | — | — |

TABLE 2-continued

| TITANIUM COMPOUND | | TITANIUM CONCENTRATION (wt %) | VOLUME OF ACETYLACETONE ADDED (g) | CASTING TEST | APPEARANCE TEST | ADHESIVE STRENGTH (kg/cm) | |
|---|---|---|---|---|---|---|---|
| | | | | | | INITIAL VALUE | AFTER AGING |
| tetra-n-butyltitanate polymer | EXAMPLE 17 | 0.08 | 1 | ○ | ○ | 0.90 | 0.90 |
| | COMPARATIVE EXAMPLE 20 | 0.08 | — | X | X | — | — |
| bis(dioctylpyrophosphate) oxyacetatetitanate | EXAMPLE 18 | 0.02 | 1 | ○ | ○ | 0.95 | 0.97 |
| | EXAMPLE 19 | 0.04 | 2 | ○ | ○ | 1.00 | 1.05 |
| | COMPARATIVE EXAMPLE 21 | 0.02 | — | X | X | — | — |

*Each laminate consisting of a polyimide film, adhesive agent and copper foil was aged for 24 hours at the temperature of 120° C. and relative humidity of 100%.

TABLE 3

| TITANIUM COMPOUND | | TITANIUM CONCENTRATION (wt %) | VOLUME OF ACETYLACETONE ADDED (g) | CASTING TEST | APPEARANCE TEST | ADHESIVE STRENGTH (kg/cm) | |
|---|---|---|---|---|---|---|---|
| | | | | | | INITIAL VALUE | AFTER AGING |
| — | COMPARATIVE EXAMPLE 1 | — | — | ○ | ○ | 0.17 | 0.28 |
| tri-n-butoxytitanium monostearate | EXAMPLE 20 | 0.1 | 4 | ○ | ○ | 0.32 | 0.89 |
| | COMPARATIVE EXAMPLE 22 | 0.1 | — | X | X | — | — |
| butyltitanate dimer | EXAMPLE 21 | 0.06 | 2 | ○ | ○ | 0.28 | 0.81 |
| | COMPARATIVE EXAMPLE 23 | 0.06 | — | X | X | — | — |
| | COMPARATIVE EXAMPLE 26 | 0.06 | 0.5 | X | X | — | — |
| tetra-n-butyltitanate | EXAMPLE 22 | 0.23 | 2 | ○ | ○ | 0.33 | 0.93 |
| | COMPARATIVE EXAMPLE 24 | 0.23 | — | X | X | — | — |
| tetrakis(2-ethylhexoxy) titanate | EXAMPLE 23 | 0.12 | 2 | ○ | ○ | 0.25 | 0.81 |
| | COMPARATIVE EXAMPLE 25 | 0.12 | — | X | X | — | — |
| ammonium salt of lactate titanate | EXAMPLE 24 | 0.2 | 2 | ○ | ○ | 0.41 | 0.89 |
| | COMPARATIVE EXAMPLE 27 | 0.2 | — | X | X | — | — |
| dihydroxy-bis(lactato) titanate | EXAMPLE 25 | 0.1 | 2 | ○ | ○ | 0.38 | 0.95 |
| | COMPARATIVE EXAMPLE 28 | 0.1 | — | X | X | — | — |
| dipropoxytitanium-bis(triethanolaminate) | EXAMPLE 26 | 0.1 | 2 | ○ | ○ | 0.57 | 1.01 |
| | COMPARATIVE EXAMPLE 29 | 0.1 | — | X | X | — | — |
| isopropyltris(dioctylpyrop hosphate) titanate | EXAMPLE 27 | 0.1 | 2 | ○ | ○ | 0.66 | 0.96 |
| | COMPARATIVE EXAMPLE 30 | 0.1 | — | X | X | — | — |
| isopropyl tridodecylbenzenesulfo nyltitanate | EXAMPLE 28 | 0.1 | 2 | ○ | ○ | 0.67 | 1.13 |
| | COMPARATIVE EXAMPLE 31 | 0.1 | — | X | X | — | — |

*Each laminate consisting of a polyimide film, adhesive agent and copper foil was aged for 24 hours at the temperature of 120° C. and relative humidity of 100%.

A method for producing a 3-layer laminate is as follows:

Each of the films obtained in the Examples 11 to 19 and Comparative Examples 12 to 21 was laminated on a copper foil (an electrolytic copper foil, 3EC VLP; a product of MITUI MINING AND SMELTING CO., LTD.) with nylon-epoxy-base adhesive agent to produce a 3-layer laminate of polyimide film, adhesive agent and copper foil. An adhesive strength of each laminate was measured by the use of

TABLE 4

| | TEAR PROPAGATION RESISTANCE | | | TENSILE ELONGATION | | |
|---|---|---|---|---|---|---|
| | ORDINARY SATATE (g) | AFTER AGING (g) | RETENTION (%) | ORDINARY SATATE (g) | AFTER AGING (g) | RETENTION (%) |
| COMPARATIVE EXAMPLE 1 | 7.4 | 2.9 | 39 | 88 | 33 | 38 |
| COMPARATIVE EXAMPLE 12 | 7.4 | 4.3 | 58 | 21 | 12 | 57 |
| COMPARATIVE EXAMPLE 14 | 7.5 | 3.9 | 52 | 35 | 22 | 63 |
| EXAMPLE 11 | 7.4 | 6.3 | 85 | 95 | 88 | 93 |
| EXAMPLE 12 | 7.2 | 6.3 | 88 | 91 | 76 | 84 |
| EXAMPLE 14 | 7.5 | 6.5 | 87 | 80 | 75 | 94 |
| EXAMPLE 15 | 7.6 | 6.3 | 83 | 84 | 73 | 87 |
| EXAMPLE 16 | 7.2 | 5.8 | 81 | 89 | 77 | 87 |
| EXAMPLE 17 | 7.2 | 6.7 | 93 | 94 | 86 | 91 |
| EXAMPLE 18 | 7.1 | 6.2 | 87 | 83 | 78 | 94 |
| EXAMPLE 20 | 7.2 | 6.3 | 88 | 86 | 72 | 84 |
| EXAMPLE 21 | 7.5 | 6.6 | 88 | 97 | 83 | 86 |
| EXAMPLE 22 | 7.4 | 6.4 | 86 | 88 | 74 | 84 |
| EXAMPLE 23 | 7.4 | 6.5 | 88 | 80 | 71 | 89 |
| EXAMPLE 24 | 7.3 | 6.2 | 85 | 85 | 70 | 82 |
| EXAMPLE 25 | 7.5 | 6.3 | 84 | 83 | 72 | 87 |
| EXAMPLE 26 | 7.1 | 5.9 | 83 | 94 | 88 | 94 |
| EXAMPLE 27 | 7.6 | 6.4 | 84 | 91 | 81 | 89 |
| EXAMPLE 28 | 7.5 | 6.6 | 88 | 83 | 73 | 88 | nylon-epoxy-base adhesive agent in accordance with JIS 6472-1995 Section 8. The obtained values are defined as initial adhesive strength of polyimide film. Results of the measurements are shown in Table 2.

After heating the laminates at the temperature of 150° C. for 300 hours in a hot-air oven, an adhesive strength of each of said laminates was measured. The obtained values are defined as adhesive strength of polyimide film after aging. Results of the measurements are shown in Table 1.

A method for producing a metal-clad polyimide film is as follows: 10 cm×10 cm of a sample film is cut out of each of the film obtained in Examples 20 to 28 and Comparative Examples 22 to 31. Each sample film was placed inside the Electron Beam Evaporator EBH6 (a product of ULVAK Co., Ltd.). A vacuum evaporated layer with a thickness of about 500 to 1000 Å was formed directly on the surfaces of polyimide film by heating with electron beam at the pressure of $1\times10^{-4}$ Torr.

Finally, a 35 μm-thick copper plate layer was formed on the vacuum evaporated layer of said metal-clad polyimide film.

An adhesive strength of each metal-clad polyimide film was measured in accordance with JIS 6472-1995 Section 8. The obtained values are defined as initial adhesive strength of polyimide film.

In addition, metal-clad polyimide films were aged at the temperature of 120° C. and relative humidity of 100% for 24 hours. An adhesive strength of each polyimide film aged for 24 hours was measured in accordance with JIS 6472-1995 Section 8. The obtained values are defined as adhesive strength of aged polyimide film. Results of the measurements are shown in Table 3.

Next, tear propagation resistance at an ordinary state and tensile elongation of the 25 μm-thick films obtained in Examples 11, 12, 14 to 18, 20, and 21 to 28, and Comparative Examples 1, 12, and 14 each were measured by the methods of IPC-2.4.17.1 and IPC-2.4.19, respectively. In addition, retention of each value of the above measurements before and after aging at a temperature of 150° C., relative humidity of 100%, and 4 atmospheric pressure in the pressure cooker for 12 hours was measured. Results of the measurements are shown in Table 4.

What is claimed is:

1. A polyamide acid composition containing
   an organic solvent,
   a polyamide acid which is a precursor to a non-thermosetting polyimide which is a reaction product of at least one aromatic acid dianhydride and at least one diamine;
   at least one inorganic or organic metallic compound, and
   at least one inhibitor for gelation.

2. A polyamide acid composition containing
   an organic solvent
   a polyamide acid which is a precursor to a non-thermosetting polyimide which is a reaction product of at least one aromatic acid dianhydride and at least one diamine;
   at least one dehydrating agent;
   at least one catalyst;
   at least one inorganic or organic metallic compound; and
   at least one inhibitor for gelation.

3. A polyamide acid composition according to claim 1 or 2 containing one or more inhibitors for gelation selected form the group consisting of compounds represented by the general formula (1)

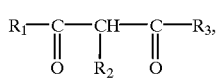

the general formula (2)

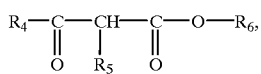

the general formula (3)

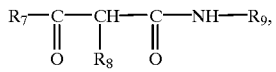

and the general formula (4)

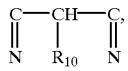

wherein $R_1$, $R_3$, $R_4$, $R_6$, $R_7$ and $R_9$ each represent the same or different aliphatic group or aromatic group containing 1 to 12 of carbon atoms, $R_2$, $R_5$, $R_8$ and $R_{10}$ each represent an aliphatic group or aromatic group containing a hydrogen atom or 1 to 12 of carbon atoms, and $R_1$ and $R_3$, $R_4$ and $R_6$, and $R_7$ and $R_9$ may be combined together to form a ring.

4. Polyamide acid composition according to claim 3, wherein said inhibitors for gelation are one or more selected form the group consisting of acetylacetone, methylacetoacetate, ethylacetoacetate, alinideacetoacetate, and malononitrile.

5. A polyamide acid composition according to claim 1 or 2, wherein said inorganic or organic metallic compounds are organic metallic compounds including at least one selected form the group consisting of Ti, Zr, V, Nb, Cr, Mo, Mn, Fe, Ru, Co, Rh, Ni, Pd, Cu, Ag, Zn, Si, Sn, Pb, Sb, and Bi.

6. A polyamide acid composition according to claim 5, wherein said inorganic or organic metallic compounds are titanium organic metallic compounds.

7. A polyamide acid composition according to claim 6, wherein said titanium organic metallic compounds are one or more selected from the group consisting of the compounds represented by the general formula (5)

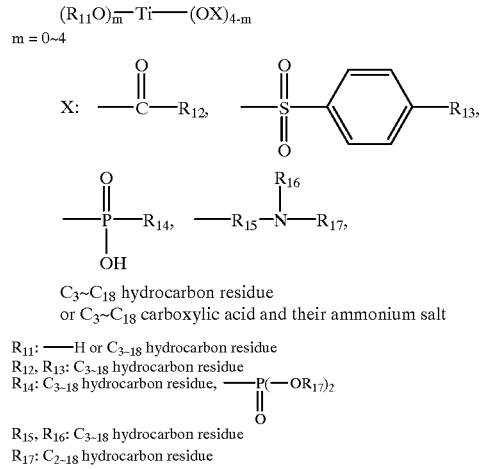

the general formula (6);

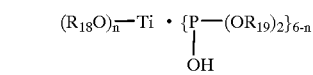

and the general formula (7);

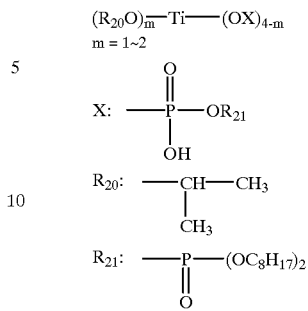

and the metal concentration is 0.001 to 0.1 wt % of a finally-cured polyimide film.

8. A polyamide acid composition according to claim 7, wherein said titanium organometallic compound is a titanium organic metal chelate compound.

9. A polyamide acid composition according to claim 8, wherein said titanium organic metal chelate compound is a compound consisting of a titanium atom combined with one or more ligands selected from the group consisting of β-diketone, hydroxy carboxylic acid, keto-ester chelate, and glycol.

10. A polyamide acid composition according to claim 9, wherein said polyamide acid is obtained from pyromellitic acid dianhydride, 4,4'-diaminodiphenyl ether, and p-phenylene diamine.

11. A polyamide acid composition comprising:
an organic solvent;
a reaction product of at least one aromatic acid dianhydride and at least one diamine,
at least one inorganic or organic metallic compound, and
at least one inhibitor for gelation selected from the group consisting of compounds represented by the formulas:

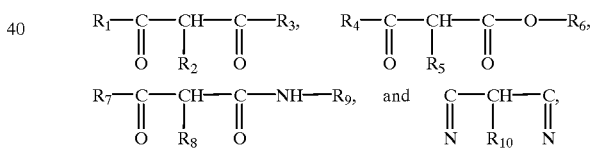

wherein $R_1$, $R_3$, $R_4$, $R_7$ and $R_9$ each represent the same or different aliphatic group or aromatic group containing 1 to 12 carbon atoms,
$R_2$, $R_5$, $R_8$, and $R_{10}$ each represent an aliphatic group or aromatic group containing a hydrogen atom or 1 to 12 carbon atoms, and
$R_1$ and $R_2$, $R_4$ and $R_6$, $R_7$ and $R_9$ may be combined together to form a ring.

12. The polyamide acid composition according to claim 11, wherein said at least one inhibitor for gelation is selected from the group consisting of acetylacetone, metylacetacetate, ethylacetoacetate, anilideaetoacetate and malononitrile.

13. The polyamide composition according to claim 11, wherein said at least one said inorganic or organic metallic compound has a metal atom selected from the group consisting of Ti, Zr, V, Nb, Cr, Mo, Mn, Fe, Ru, Co, Rh, Si Ni, Pd, Cu, Ag, Zn, Sn, Pb, Sb, and Bi.

14. A polyamide acid composition according to claim 13, wherein said inorganic or organic metallic compound is at least one titanium organic metallic compound.

15. A polyamide acid composition to claim 14, wherein said at least one titanium organic metallic compound is one or more selected from the group consisting of the compounds represented by:

the general formula (8):

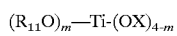

wherein m is 0–4, X represents:

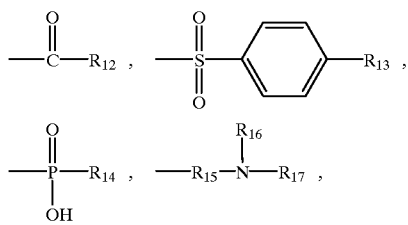

or a $C_3$–$C_{18}$ hydrocarbon residue or a residue of a carboxylic acid or the ammonium salt thereof, $R_{11}$ represents H or a $C_3$–$C_{18}$ hydrocarbon residue, $R_{12}$ and $R_{13}$ represent a $C_3$–$C_{18}$ hydrocarbon residue, $R_{14}$ represents a $C_3$–$C_{18}$ hydrocarbon residue or

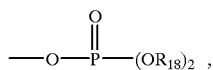

hydrocarbon residue;

the general formula (9):

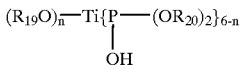

wherein n is 0–6, $R_{19}$ represents a $C_3$–$C_{18}$ hydrocarbon residue and $R_{20}$ represents a $C_3$–$C_{18}$ hydrocarbon residue;

the general formula (10):

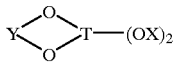

wherein X represents

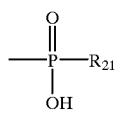

$R_{21}$ represents —O—P(=O)(OC$_8$H$_{17}$)$_2$, and

Y represents —C(=O)—CH$_2$— or —CH$_2$—CH$_2$— ; and the general formula (11):

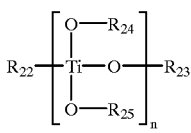

wherein n is an integer of 1 or more, $R_{22}$ represents a $C_3$–$C_4$ hydrocarbon residue, $R_{23}$ represents a $C_3$–$C_4$ hydrocarbon residue, $R_{24}$ represents a $C_3$–$C_4$ hydrocarbon residue, and $R_{25}$ represents

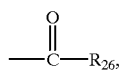

wherein $R_{26}$ represents a $C_3$–$C_{18}$ hydrocarbon residue.

16. A polyimide film obtained by the use of the polyamide acid composition according to any one of claims 1, 2, and 11.

17. A polyimide molding obtained by the use of polyamide acid or composition according to any one of claims 1, 2 and 11.

18. A flexible printed wiring board produced by laminating a polyimide film according to claim 16 and a copper foil together with an adhesive agent.

19. A flexible printed wiring board produced by bonding a metal layer directly to a polyimide film according to claim 16.

20. A method for producing a polyimide film according to claim 16, wherein said at least one inorganic or organic metallic compound and said at least one inhibitor for gelation are added in any steps of producing said polyamide acid composition.

21. A method for producing a polyimide film according to claim 16, wherein said at least one inhibitor for gelation is added in any step in producing the polyamide acid and said at least one inorganic or organic metallic compound is added after or at the same time with said at least one inhibitor for gelation.

22. A method for producing a polyimide film according to claim 16, wherein said at least one inhibitor for gelation is added to said organic solvent solution of polyamide acid.

23. A method for producing a polyimide film according to claim 20, wherein said at least one inhibitor for gelation is added to a mixed solution of a dehydrating and cyclizing agent and catalyst, and the resultant mixture is added to said organic solvent solution of said polyamide acid.

24. A method for producing a polyimide film according to claim 16, wherein said at least one organic or inorganic metallic compound is a titanium compound which is added to said organic solvent solution of polyamide acid in the step of preparing said polyamide acid composition.

25. A method for producing a polyimide film according to claim 16, wherein said at least one titanium organic metallic compound is added to a mixed solution of a dehydrating and cyclizing agent and catalyst, and the resultant mixture is used in the production of said polyamide acid composition.

26. An imidizable polyamide acid composition obtainable by blending at least one aromatic acid dianhydride and at least one diamine in an organic solvent, adding at least one inorganic or organic metallic compound, and adding at least one inhibitor for gelation.

27. An imidizable polyamide acid composition according to claim 26, wherein said polyamide acid is prepared in situ in the presence of said at least one inhibitor for gelation.

28. An imidizable polyamide acid composition according to claim 27, wherein said at least one inorganic or organic metallic compound is added to said organic solvent solution simultaneously or subsequent to the addition of said at least one inhibitor for gelation.

* * * * *